United States Patent [19]
Grünewald et al.

[11] Patent Number: 5,917,334
[45] Date of Patent: *Jun. 29, 1999

[54] METHOD AND APPARATUS FOR DECOUPLING A HIGH-FREQUENCY ERROR SIGNAL FROM A HIGH-FREQUENCY ELECTROMAGNETIC FIELD IN A HEAVY ELECTRICAL MACHINE

[75] Inventors: Peter Grünewald; Jürgen Weidner, both of Essen; Reinhold Koziel, Mülheim an der Ruhr, all of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/408,643

[22] Filed: Mar. 22, 1995

Related U.S. Application Data

[63] Continuation of application No. PCT/DE93/00815, Sep. 7, 1993.

[30] Foreign Application Priority Data

Sep. 22, 1992 [DE] Germany .............................. 42 31 714

[51] Int. Cl.$^6$ .................................................. G01R 31/34
[52] U.S. Cl. ............................................................ 324/772
[58] Field of Search ..................... 324/772, 546, 324/545, 536, 158.1, 73.1; 374/153, 183; 318/490; 340/648; 322/99; 73/862.336

[56] References Cited

U.S. PATENT DOCUMENTS

| | | | |
|---|---|---|---|
| 3,641,439 | 2/1972 | Aslan | 324/106 |
| 4,083,001 | 4/1978 | Paice | 324/772 |
| 4,114,077 | 9/1978 | Oates et al. | 318/473 |

(List continued on next page.)

FOREIGN PATENT DOCUMENTS

| | | |
|---|---|---|
| 0 228 613 | 8/1990 | European Pat. Off. . |
| 0 241 764 | 8/1990 | European Pat. Off. . |
| 0 408 813 | 1/1991 | European Pat. Off. . |
| 32 34 023 | 3/1984 | Germany . |
| 35 35 550 | 4/1986 | Germany . |
| 35 26 149 | 12/1986 | Germany . |
| 34 08 256 | 7/1987 | Germany . |
| 39 18 116 | 12/1990 | Germany . |

OTHER PUBLICATIONS

IEEE Transactions on Power Apparatus and Systems, No. 4 1983, pp. 28–33, "Development of a Collector . . . " (no month available).

Electro–Jahr Publication 1979 (Raasch), "Messen und . . . " mentioned on pp. 3–4 of the specification (no month available).

*Primary Examiner*—Vinh P. Nguyen
*Attorney, Agent, or Firm*—Herbert L. Lerner; Laurence A. Greenberg

[57] ABSTRACT

A method for decoupling a high-frequency error signal from a high-frequency electromagnetic field in a heavy electrical machine includes decoupling a high-frequency error signal with at least one temperature probe acting as an antenna and being associated with a stator carrying an electrical winding. In a heavy electrical machine having a stator carrying an electrical winding, an apparatus for decoupling a high-frequency error signal from a high-frequency electromagnetic field includes at least one temperature probe being disposed in the stator for generating a low-frequency temperature signal. The at least one temperature probe has connecting lines leading out of the stator. A diplexer decouples the error signal from the temperature signal. The diplexer has an input to which the connecting lines are connected, a first output at which the temperature signal is furnished, and a second output at which the error signal is furnished.

18 Claims, 4 Drawing Sheets

U.S. PATENT DOCUMENTS

| | | | |
|---|---|---|---|
| 4,238,733 | 12/1980 | Freeman | 324/772 |
| 4,779,051 | 10/1988 | Grunewald et al. | 324/536 |
| 4,814,699 | 3/1989 | Koziel et al. | 324/545 |
| 4,949,001 | 8/1990 | Campbell . | |
| 5,019,760 | 5/1991 | Chu et al. | 324/772 |
| 5,257,863 | 11/1993 | Chu et al. | 318/490 |
| 5,262,717 | 11/1993 | Bolegoh | 73/862.336 |
| 5,416,430 | 5/1995 | Twerdochlib et al. | 324/772 |
| 5,475,312 | 12/1995 | Sedding et al. | 324/772 |

METHOD AND APPARATUS FOR DECOUPLING A HIGH-FREQUENCY ERROR SIGNAL FROM A HIGH-FREQUENCY ELECTROMAGNETIC FIELD IN A HEAVY ELECTRICAL MACHINE

CROSS REFERENCE TO RELATED APPLICATION

This application is a Continuation of International Application Serial No. PCT/DE93/00815, filed Sep. 7, 1993.

BACKGROUND OF THE INVENTION

Field of the Invention

The invention relates to a method and an apparatus for decoupling a high-frequency error signal from a high-frequency electromagnetic field in a heavy electrical machine, having a stator that carries an electric winding.

The invention relates in particular to operational monitoring of a heavy electrical machine and above all to the detecting of defects. Specifically, reference is made to defects that cause spark formation during operation in the heavy electrical machine.

The term "heavy electrical machines" is understood in the present context particularly to mean large generators, such as turbogenerators, having electrical outputs which are 50 MVA and more.

Detecting defects in systems with heavy electrical machines is gaining steadily increasing interest, in an attempt to increase the availability of the system and to detect defects as early as possible, and if at all possible even to predict them, preferably during regular operation. It is also significant that digital computer systems for evaluating the signals from complex monitoring systems are increasingly available at an acceptable cost.

Methods and apparatuses for detecting, and optionally locating, defects in electrical systems, especially systems with heavy electrical machines, are disclosed in German Patent DE 34 08 256 C2, German Published, Non-Prosecuted Application DE 35 26 149 A1, German Published, Non-Prosecuted Application DE 39 18 116 A1, European Patent Specification 0 228 613 B1 corresponding to U.S. Pat. No. 4,814,699, and European Patent Specification 0 241 764 B1. Those references disclose entire systems for detecting and locating defects in electrical systems that involve evaluations of high-frequency error signals, and also disclose details for decoupling high-frequency error signals from high-frequency fields in heavy electrical machines. U.S. Pat. No. 4,949,001 relates to the detection of partial discharges in the stator of a dynamo electrical heavy machine, especially a turbogenerator. According to that patent, a measurement value pickup is made by stripline technology and while acting as an antenna for decoupling a high-frequency error signal, in the manner of a directional coupler, it is placed on the stator and connected to an evaluation device through suitable connecting lines. By evaluating the level and/or the course over time of the error signals, it is possible to locate the point where the error signals have originated. In order to avoid further repetition herein, the content of all of the references cited above is expressly incorporated herein by reference.

One important aspect in decoupling high-frequency error signals from a heavy electrical machine is to make the best possible utilization of components and devices that are present anyway, so that additional components will not impair or even shield the high-frequency electromagnetic fields caused by errors or the like. Moreover, economic aspects which must be considered may make overly complex sensor systems disadvantageous. Finally, considerations of the load capability and efficiency of the heavy electrical machines argue against making overly generous space available for operational monitoring systems.

A heavy electrical machine in the form of an asynchronous motor, having a stator that carries an electrical winding, and in which the winding is placed in slots of the stator and a temperature measuring sensor is disposed in a slot, is known from the article entitled "Messen und Überwachen von Temperaturen an großen Asynchronmotoren" [Measuring and Monitoring Temperatures in Heavy Asynchronous Motors], by W. Raasch, in Elektro-Jahr [Electrical Engineering Yearbook] 1979, published by Vogel-Verlag, Würzburg, Germany, pages 27–30.

SUMMARY OF THE INVENTION

It is accordingly an object of the invention to provide a method and an apparatus for decoupling a high-frequency error signal from a high-frequency electromagnetic field in a heavy electrical machine, which overcome the hereinafore-mentioned disadvantages of the heretofore-known methods and devices of this general type and in which recourse is made solely to already existing devices to the maximum possible extent.

With the foregoing and other objects in view there is provided, in accordance with the invention, a method for decoupling a high-frequency error signal from a high-frequency electromagnetic field in a heavy electrical machine, which comprises decoupling a high-frequency error signal with at least one temperature probe acting as an antenna and being associated with a stator carrying an electrical winding.

According to the invention, a monitoring device that as a rule is already present, namely a monitoring device for the operating temperature, which has at least one temperature probe, is employed for decoupling the high-frequency error signal. The particular type of temperature probe is important only in the sense that it must be suitable as an antenna for high-frequency signals. This means above all that at least in part it should have an adequate electrical conductivity and not be overly small in size. However, this is already true of conventionally used temperature probes. Often, temperature probes are in fact used with temperature-dependent electrical resistors, which are provided with connecting lines that are already many centimeters long. Any temperature probes that have metal sheathing tubes or similar components and that can otherwise be operated in a virtually arbitrary way are also readily possible. Another reason temperature probes are especially advantageous is that in a stator of a heavy electrical machine, they are always disposed in the vicinity of the electrical winding (which generates elevated temperatures), or in other words in the vicinity of the part that is most critical for sparking.

Accordingly, the intensity of the high-frequency signals that can be picked up from the conventional temperature probe is not a problem since as a rule, because the possible error forces are so close by, a relatively strong high-frequency electromagnetic field in the surroundings of the temperature probe and therefore an adequate intensity of the error signal obtained by means of the temperature signal is assured. Moreover, in any case, the temperature measured by a temperature probe in a heavy electrical machine is a variable that only changes little over time, that can be represented by a very low-frequency signal, practically a signal of zero frequency, and that thus permits problem-free discrimination between temperature signals and high-frequency error signals.

The fact that electrically operated temperature probes can advantageously be employed in the context of the invention, and especially temperature probes that are operated with electrical direct voltage or electrical direct current, has already been mentioned. An especially suitable temperature probe is one that has a probe element located in the stator of the heavy electrical machine, with connecting lines being connected to it and leading out of the stator. In such a temperature probe, the connecting lines can act directly as antennas, and in particular as quarter-wave antennas. With such a temperature probe, high-frequency error signals can also be obtained that are not affected by the probe element used to obtain the temperature signals. By way of example, two electric connecting lines that are twisted together lead away from the feeler or sensor element and are tapped in phase in order to derive the high-frequency error signals. Then the connecting lines act like a single antenna, and depending on its construction the probe element contributes not at all, or only very slightly, to the error signals. By way of example, a probe element that is nearly a three-dimensionally small resistor element with a temperature-dependent electrical resistor would not make any contribution. In any case, it is advantageous for the error signals to be picked up by the temperature probe simultaneously with the temperature signal, and then to be decoupled from the signals afterward. This can be especially simply done if the temperature signals are low-frequency signals, especially direct current signals or direct voltage signals.

In accordance with another mode of the invention, the temperature probes which are present in great numbers in the heavy electrical machine are utilized as antennas.

In accordance with a further mode of the invention, the many temperature probes are distributed essentially uniformly over the stator, so that the error signals of the temperature probes can be correlated with one another in order to ascertain a location in the heavy machine where they were caused. This embodiment makes advantageous use of the fact that high-frequency electromagnetic fields in a heavy electrical machine are damped considerably in their propagation, so that the error signals, which are obtainable with the high-frequency fields that originate at a certain point, depend substantially in their intensity on the positioning of a temperature probe used for the decoupling. If there is an adequate number of temperature probes, it is therefore possible to draw a conclusion as to the point where the error signals were caused, by weighting the intensity (and under some circumstances the phase relationships as well) of the error signals being obtained.

With the objects of the invention in view, there is also provided, in a heavy electrical machine having a stator carrying an electrical winding, an apparatus for decoupling a high-frequency error signal from a high-frequency electromagnetic field, comprising at least one temperature probe being disposed in the stator for generating a low-frequency temperature signal, the at least one temperature probe having connecting lines leading out of the stator; and a diplexer for decoupling the error signal from the temperature signal, the diplexer having an input to which the connecting lines are connected, a first output at which the temperature signal is furnished, and a second output at which the error signal is furnished.

The apparatus according to the invention furnishes an error signal which is picked up from a temperature probe disposed in the stator and is decoupled from a temperature probe signal likewise originating in the temperature probe.

In accordance with another feature of the invention, the temperature probe is operated electrically, it furnishes a low-frequency signal, preferably a direct current signal, as its temperature signal, and the diplexer is equipped in such a way that it acts as a low-pass filter with respect to the first output and as a high-pass filter with respect to the second output. This means that a low-frequency signal fed to the input is supplied to the first output by the diplexer, and a high-frequency signal fed to the input is furnished to the second output by the diplexer. It will be understood that the outputs of the diplexer may optionally be followed by additional filters, in particular high-pass, low-pass or band-pass filters. It is understood that amplifiers and other signal processing devices may also be included.

In accordance with an added feature of the invention, the temperature probe is located in a slot that is one of a number of slots of the stator and winding bars of the winding are placed in the slots. In this way, the temperature probe is immediately adjacent the winding at which sparking and the like can primarily occur, and as a result a quite strong high-frequency electromagnetic field in the surroundings of the temperature probe, and therefore an adequate intensity of the error signals to be picked up from the temperature probe, is assured.

In accordance with a further feature of the invention, the temperature probe is located in an electrically insulating intermediate layer that is disposed in a slot between two winding bars located one above the other in the slot. In this way, the temperature probe is sensitive to high-frequency electromagnetic fields that originate from the two winding bars in the slot, and it is located in an electrically insulating layer in which the propagation of high-frequency electromagnetic fields is relatively readily possible.

In accordance with an additional feature of the invention, the temperature probe has a resistor element with a temperature-dependent electrical resistor as its actual probe element for forming the temperature signals.

In accordance with yet another feature of the invention, there is provided a number of temperature probes for furnishing temperature signals and error signals, with the temperature probes preferably being distributed uniformly over the stator.

The invention makes it possible to detect sparking in a heavy electrical machine in an especially advantageous way. The conclusion as to sparking is drawn from the occurrence of a high-frequency error signal at a temperature probe. In particular, the invention enables especially advantageous detection and, in the context of a further feature, location of defects.

In accordance with a concomitant feature of the invention, a high-frequency error signal to be decoupled in accordance with the invention is advantageously in a frequency range between 1 MHz and 300 MHz, and in particular between 3 MHz and 100 MHz. Temperature probes with conventional geometric dimensions are especially suitable for detecting high-frequency error signals with such frequencies.

Other features which are considered as characteristic for the invention are set forth in the appended claims.

Although the invention is illustrated and described herein as embodied in a method and an apparatus for decoupling a high-frequency error signal from a high-frequency electromagnetic field in a heavy electrical machine, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
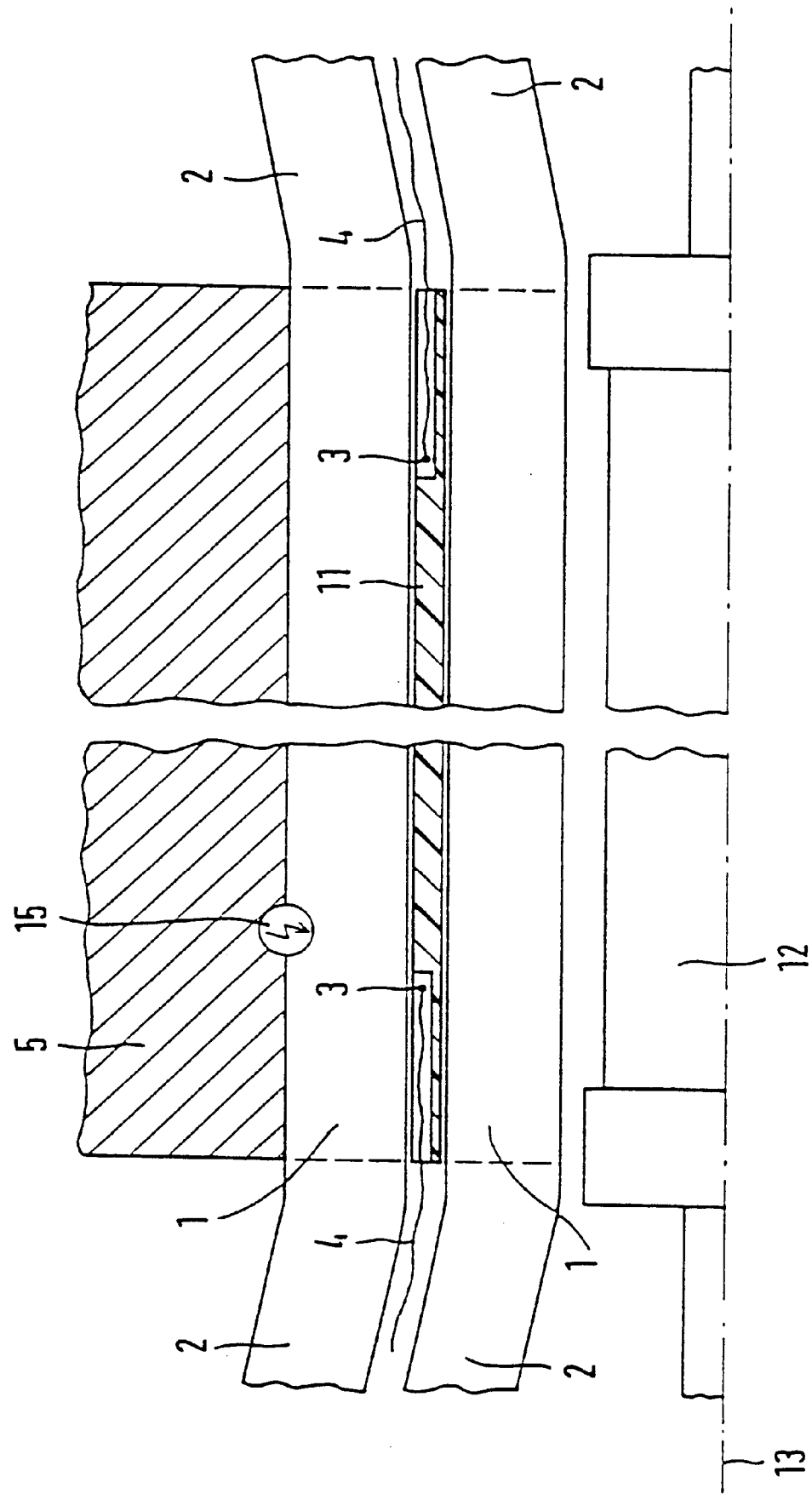
FIG. 1 is a fragmentary, diagrammatic, axial longitudinal-sectional view of a heavy electrical machine with temperature probes to be used in accordance with the invention.
Figure 2:
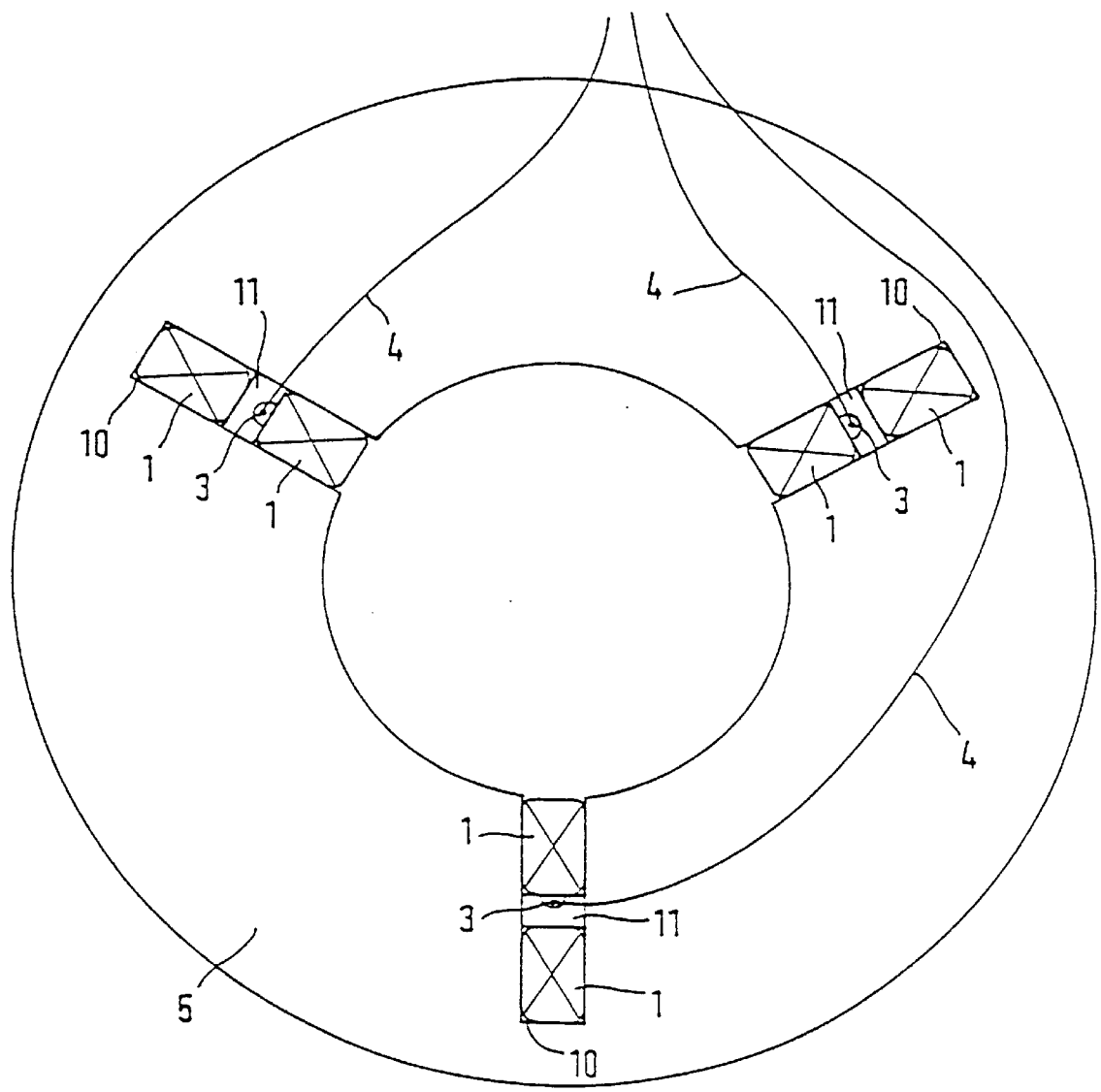
FIG. 2 is a radial cross-sectional view of the machine shown in FIG. 1.

Referring now to the figures of the drawing in detail and first, particularly, to FIG. 1 thereof, there is seen a longitudinal section, taken along an axis 13, through a heavy electrical machine with a stator 5 and with a rotor 12 being disposed in a recess in the stator 5 and being rotatable about the axis 13. The stator 5 has slots 10 formed therein as is seen in FIG. 2, in which two electric winding bars 1, 2 are disposed, as components of the electrical winding. Each winding bar 1, 2 has one straight segment 1, which rests in the slot 10, and two curved segments 2, each on one end of the straight segment 1. The curved segments 2 extend outside the slot 10 and serve to connect various winding bars to one another. An intermediate layer 11 of insulating material is located between the straight segments 1. One temperature probe 3, 4 is located on each end of the stator 5 in the intermediate layer 11. Each probe has a probe element 3, in particular a resistor element with a temperature-dependent electrical resistor, and connection lines 4 which lead out of the stator 5 and are to be connected to signal processing devices for evaluating the temperature signals and error signals. These signal processing devices are not shown in FIG. 1. The two temperature probes 3, 4 may be utilized to locate a defect 15, at which sparking, for instance in the context of a partial discharge, occurs during operation of the heavy electrical machine. Since the defect 15 is substantially closer to the temperature probe 3, 4 shown on the left than to that shown on the right, the error signal that occurs in the left-hand temperature probe 3, 4 is substantially greater than the error signal that can be taken from the right-hand temperature probe 3, 4. From this simple example it can be seen how locating the defect 15 can be done. The thus available locating system for error signals can advantageously be expanded by additional temperature probes, especially temperature probes approximately in the middle of the stator 5.

It should again be pointed out that FIG. 1 does not show all of the conventional characteristics of a heavy electrical machine. For instance, the stator 5 is shown as a compact block, which is not absolutely how it may look in conventional practice. Means for closing the slots in which the winding bars 1, 2 are located are not shown either. Moreover, the size relationships shown are not to accurate scale. In order to supplement the information provided for FIG. 1 and the following drawing figures, reference may be made to the professional competence of one of ordinary skill in this art.

FIG. 2 shows a cross section, at right angles to the axis, through the machine of FIG. 1. The stator 5 has the slots 10 into which the straight segments 1 of the winding bars 1, 2 are placed. Three slots 10 are shown, as representatives for slots 10 that are typically present in great numbers in heavy electrical machines. The two straight segments 1, with an intermediate layer 11 inserted between them, are located one above the other in each slot 10. One probe element 3 with the connecting lines 4 is located in each intermediate layer 11.

Figure 3:
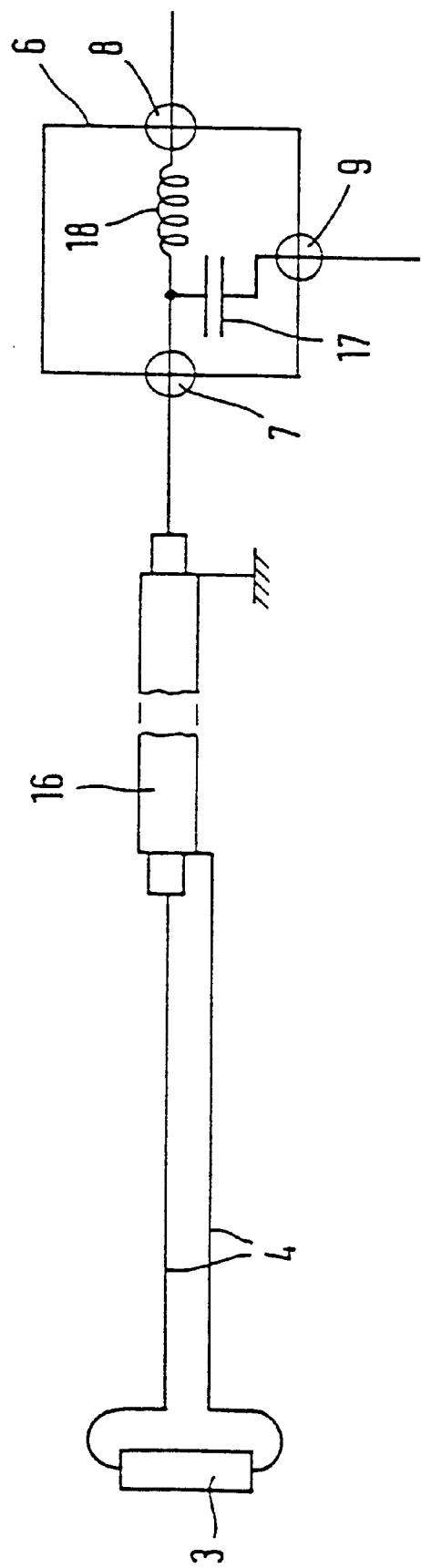
FIGS. 3 and 4 are partly broken-away elevational views of exemplary embodiments of temperature probes constructed along the lines of the invention.
Figure 4:
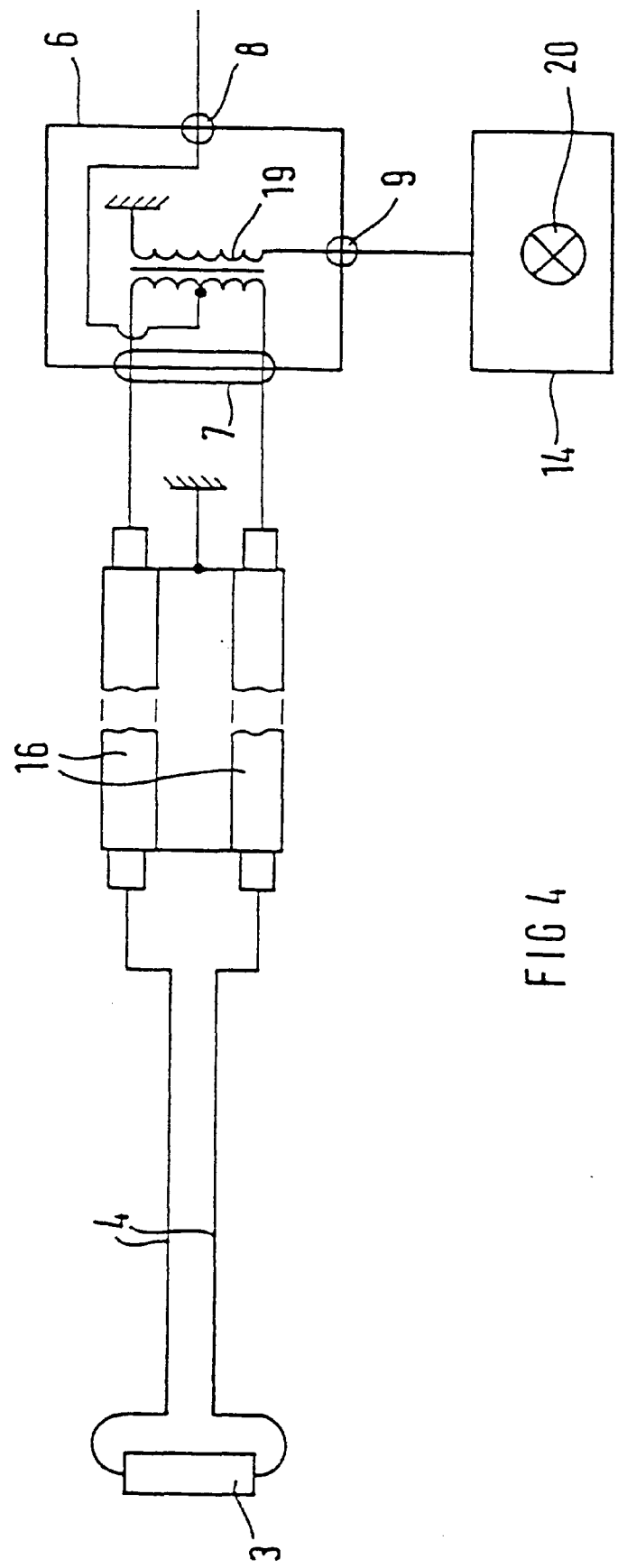

FIGS. 3 and 4 show two exemplary embodiments of temperature probes that are usable as antennas, including probe elements, in particular resistor elements with temperature-dependent electrical resistors, the connecting lines 4 and diplexers 6 for decoupling the error signals from the temperature signals. In FIG. 3, the connecting lines 4 are connected to a coaxial cable 16, specifically one connecting line 4 is connected to the inner conductor and another connecting line 4 is connected to the outer conductor, which in turn is grounded. The mixture of a temperature signal and an error signal obtained from the temperature probe is delivered from the coaxial cable 16 to an input 7 of the diplexer 6. The decoupling of the error signal from the temperature signal takes place in the diplexer 6. The temperature signal is supplied from the input 7 through a coil 18, which forms a low-pass filter for admitting signals at low frequencies, to a first output 8 of the diplexer 6, and the error signal passes from the input 7 through a capacitor 17 to a second output 9 of the diplexer 6. The capacitor 17 forms a high-pass filter, which allows only high-frequency signals to pass through it. The error signal can be delivered from the second output 9 of the diplexer 6 to a non-illustrated evaluation device. The precise function of the temperature probe, which is formed by the probe element 3 and the connecting lines 4, as an antenna for the high-frequency error signal, naturally depends substantially on the frequency of the error signal and on the geometric dimensions of the temperature probe. However, with the temperature probe of FIG. 3, essentially a capacitive coupling to a high-frequency electromagnetic field in the heavy electrical machine is attained.

FIG. 4 shows a different embodiment of the temperature probe, in which the connecting lines 4 and the probe element 3 act substantially as an inductive antenna for high-frequency signals. According to FIG. 4, the temperature probe is connected to two coaxial cables 16 with grounded outer conductors. The connecting lines 4 are connected to the internal conductors of the coaxial cable 16. The input 7 of the diplexer 6 is constructed for the connection of both coaxial cables 16. The decoupling of the error signal from the temperature signal is effected by means of a transformer 19. A primary winding of the transformer 19, which is connected to the input 7, has a center tap or is double-wound, and a terminal corresponding to a center tap is then provided. The first output 8 is connected to the center tap of the primary winding for derivation of the low-frequency temperature signal. In the transformer 19, the high-frequency error signal is transferred to a secondary winding and from there is delivered to the second output 9 of the diplexer 6. An evaluation device 14, which naturally may contain additional filters, and in which the error signal can be evaluated, is connected to the second output 9. The manner of evaluation meets the requirements of the individual case. In particular, an evaluation for finding problems in the electrical machine is possible. In order to indicate such problems, the evaluation device 14 is provided with an indicator element 20, which is shown by way of example as a lamp. Of course the element 20 may issue an audio indication or an electrical signal.

In an especially simple and reliable way, the invention enables decoupling of a high-frequency error signal from a high-frequency electromagnetic field in a heavy electrical machine, and in particular it enables the detection of a defect that involves sparking.

We claim:

1. A method for detecting a high-frequency error signal caused by an error in a heavy electrical machine from a high-frequency electromagnetic field, the heavy electrical machine including a stator having a temperature probe configuration associated with the stator, the temperature probe configuration having an electrically conductive temperature probe element for measuring a temperature of the stator and for providing a temperature signal, which comprises:

using an electrically conductive temperature probe configuration which provides a temperature signal as a receiving antenna for receiving a high-frequency error signal resulting in a mixed signal composed of the temperature signal and the high-frequency error signal;

conducting the mixed signal out of a stator; and decoupling the high-frequency signal from the mixed signal outside of the stator.

2. The method according to claim 1, which comprises acting upon the temperature probe configuration with electrical direct voltage or electrical direct current for obtaining the temperature signal.

3. The method according to claim 1, which comprises placing a probe element of the temperature probe configuration in the stator, and connecting the probe element to connecting lines extending out of the stator.

4. The method according to claim 1, which comprises selecting the temperature signal as a low-frequency signal.

5. The method according to claim 1, which comprises selecting the temperature signal as a low-frequency, direct current signal.

6. The method according to claim 1, which comprises picking up high-frequency error signals from a multiplicity of temperature probe configurations.

7. The method according to claim 6, which comprises:

a) distributing the temperature probe configurations substantially uniformly over the stator; and b) correlating the high-frequency error signals of the temperature probe configurations with one another to ascertain a location in the heavy machine where the high-frequency error signals were caused.

8. The method according to claim 1, which comprises detecting sparking in the heavy electrical machine by drawing conclusion as to sparking from an occurrence of the high-frequency error signal.

9. The method according to claim 1, which comprises drawing a conclusion as to defects in the heavy electrical machine from an occurrence of the high-frequency error signal.

10. The method according to claim 1, which comprises decoupling the high-frequency error signal with a frequency between 1 MHz and 300 MHz.

11. The method according to claim 1, which comprises decoupling the high-frequency error signal with a frequency between 3 MHz and 100 MHz.

12. In a heavy electrical machine having a stator carrying an electrical winding, an apparatus for decoupling a high-frequency error signal from a high-frequency electromagnetic field, comprising:

a temperature probe arrangement comprising an electrically conductive temperature probe disposed in the stator for generating a low-frequency temperature signal, said temperature probe arrangement having connecting lines connected to said temperature probe and leading out of the stator; and a diplexer for decoupling the error signal from the temperature signal, said diplexer having an input to which said connecting lines are connected, a first output at which the temperature signal is furnished, and a second output at which the error signal is furnished.

13. The apparatus according to claim 12, wherein:

a) said temperature probe is to be operated electrically; and b) said diplexer acts as a low-pass filter with respect to said first output and as a high-pass filter with respect to said second output.

14. The apparatus according to claim 12, wherein said temperature probe is disposed in one of a multiplicity of slots in the stator in which winding bars of the winding are disposed.

15. The apparatus according to claim 14, wherein said temperature probe is disposed in an electrically insulating intermediate layer being disposed in one of the slots between two of the winding bars disposed one above the other.

16. The apparatus according to claim 12, wherein said temperature probe has a resistor element with a temperature-dependent electrical resistor.

17. The apparatus according to claim 12, wherein said temperature probe arrangement comprises a multiplicity of temperature probes.

18. The apparatus according to claim 17, wherein said multiplicity of temperature probes is distributed uniformly over the stator.

* * * * *